United States Patent
Thompson

(10) Patent No.: US 10,814,875 B2
(45) Date of Patent: Oct. 27, 2020

(54) REGENERATIVE BRAKING SYSTEM FOR AN IMPLEMENT

(71) Applicant: CNH INDUSTRIAL CANADA, LTD., Saskatoon (CA)

(72) Inventor: Dennis George Thompson, Eagle Ridge (CA)

(73) Assignee: CNH Industrial Canada, Ltd., Saskatoon, Saskatchewan (CA)

( * ) Notice: Subject to any disclaimer, the term of this patent is extended or adjusted under 35 U.S.C. 154(b) by 17 days.

(21) Appl. No.: 16/263,146

(22) Filed: Jan. 31, 2019

(65) Prior Publication Data

US 2020/0247411 A1    Aug. 6, 2020

(51) Int. Cl.
| | |
|---|---|
| H02P 3/14 | (2006.01) |
| H02P 3/18 | (2006.01) |
| B60W 30/18 | (2012.01) |
| B60L 7/14 | (2006.01) |
| G01R 31/382 | (2019.01) |
| H02J 7/16 | (2006.01) |
| B60K 1/02 | (2006.01) |

(52) U.S. Cl.
CPC ......... B60W 30/18127 (2013.01); B60K 1/02 (2013.01); B60L 7/14 (2013.01); G01R 31/382 (2019.01); H02J 7/16 (2013.01); *B60W 2300/152* (2013.01)

(58) Field of Classification Search
CPC .................. B60W 30/18127; G01R 21/382
USPC ........................................................ 318/376
See application file for complete search history.

(56) References Cited

U.S. PATENT DOCUMENTS

| | | | |
|---|---|---|---|
| 6,615,946 B2 | 9/2003 | Pasquini et al. | |
| 7,374,256 B2 | 5/2008 | Vandendriessche et al. | |
| 7,472,546 B2 | 1/2009 | Anderson | |
| 10,500,975 B1* | 12/2019 | Healy | B60L 15/2009 |
| 2004/0263099 A1* | 12/2004 | Maslov | B60L 50/66 |
| | | | 318/400.24 |
| 2008/0169144 A1 | 7/2008 | DeGrave et al. | |
| 2010/0065356 A1 | 3/2010 | Reddy et al. | |
| 2011/0144840 A1* | 6/2011 | Ye | B60K 6/46 |
| | | | 701/22 |
| 2011/0253466 A1 | 10/2011 | Sedoni et al. | |
| 2016/0152138 A1 | 6/2016 | McCann | |
| 2016/0185225 A1* | 6/2016 | Namuduri | B60L 15/2054 |
| | | | 701/22 |
| 2017/0355259 A1* | 12/2017 | Borud | B60K 6/442 |
| 2018/0086227 A1* | 3/2018 | Healy | B60L 15/2045 |
| 2019/0232950 A1* | 8/2019 | Atluri | B60W 30/18145 |

FOREIGN PATENT DOCUMENTS

CN        104442411 A        3/2015

* cited by examiner

*Primary Examiner* — Erick D Glass
(74) *Attorney, Agent, or Firm* — Rebecca L. Henkel; Rickard K. DeMille

(57) ABSTRACT

An agricultural implement is provided. The agricultural implement includes an energy storage system configured to provide power to an electrical system of the agricultural implement. The agricultural implement also includes a regenerative braking system configured to slow or stop the agricultural implement and to provide power to the energy storage system.

11 Claims, 3 Drawing Sheets

REGENERATIVE BRAKING SYSTEM FOR AN IMPLEMENT

BACKGROUND

The disclosure relates generally to an agricultural implement and, more specifically, a regenerative braking system for an implement.

Agricultural work implements utilize electrical components and electrical drives which are powered by a towing vehicle that tows the implement. These agricultural implements may include an on-board electrical system with batteries to power the components of the electrical system. Typically, these batteries are charged via on-board charging systems which are typically hydraulically or mechanically driven using power supplied by the towing vehicle. However, driving these charging systems is inefficient and can limit power available for the implement needed for other system functions.

SUMMARY

Certain embodiments commensurate in scope with the originally claimed subject matter are summarized below. These embodiments are not intended to limit the scope of the claimed subject matter, but rather these embodiments are intended only to provide a brief summary of possible forms of the disclosure. Indeed, the disclosure may encompass a variety of forms that may be similar to or different from the embodiments set forth below.

In one embodiment, an agricultural implement is provided. The agricultural implement includes an energy storage system configured to provide power to an electrical system of the agricultural implement. The agricultural implement also includes a regenerative braking system configured to slow or stop the agricultural implement and to provide power to the energy storage system.

In another embodiment, a regenerative braking system for an agricultural implement is provided. The regenerative braking system includes multiple electric motors, wherein each electric motor of the multiple electric motors is coupled to a respective wheel of the agricultural implement. The regenerative braking system also includes a controller configured to cause the multiple motors to operate backwards to slow or stop the agricultural implement and to provide power to an energy storage system.

In a further embodiment, a method for utilizing a regenerative braking system for an agricultural implement is provided. The method includes actuating, via the controller, the regenerative braking system to slow or stop the agricultural implement. The method also includes enabling, via the controller, recharging of an energy storage system of the agricultural implement.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION OF THE DRAWINGS

Figure 1:
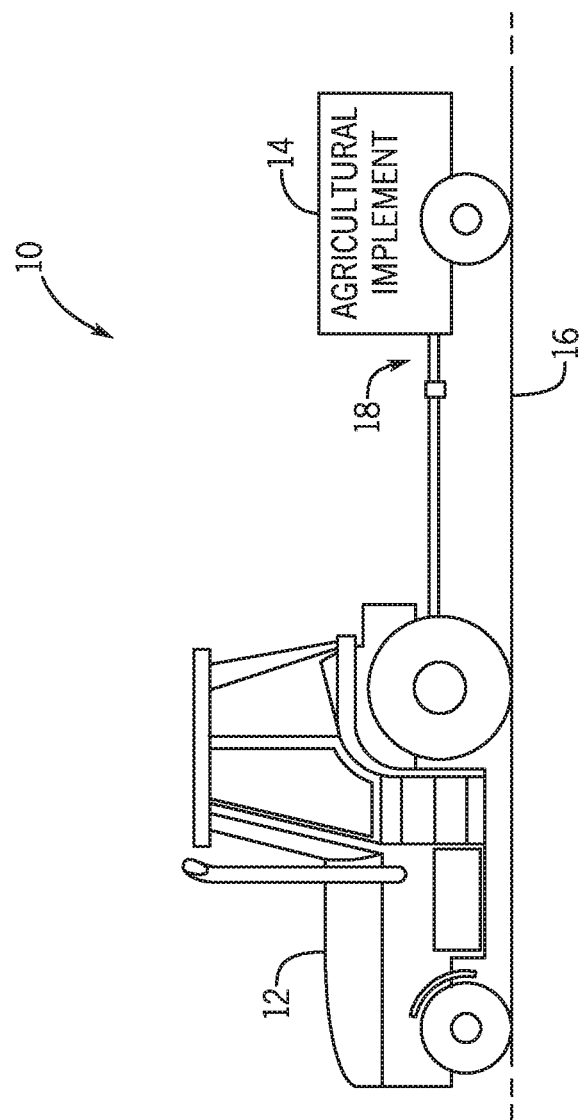
FIG. 1 is a side view of an embodiment of an agricultural system with an agricultural implement having a regenerative braking system, in accordance with an aspect of the present disclosure.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Agricultural implements may include on-board electrical systems with an energy storage system to handle the increasing use of electrical components and electric drives on the implements and to compensate for the limited electrical power available from a towing vehicle. Typically, the energy storage systems for these on-board electrical systems are charged via hydraulically driven charging systems by the towing vehicles (e.g., alternators). However, the hydraulically driven charging of the energy storage systems of the on-board electrical systems may be inefficient and also limit the hydraulic power available to be used for other system functions (e.g., product fans, lift cylinders, etc.). These agricultural implements may also include braking systems that generate wasted energy (e.g., heat). The wasted energy from these braking systems may be utilized to recharge on-board electrical systems of the agricultural implements.

Accordingly, as will be described in more detail below, embodiments described herein provide a regenerative braking system for an agricultural implement. The regenerative braking system may be utilized to recharge an energy storage system for an on-board electrical system of the agricultural implement. In certain embodiments, the regenerative braking system may be utilized in conjunction with implement stability/hill decent control system to maximize the energy generated by the regenerative braking system when operating in hilly terrain or during road transport. In certain embodiments, manual braking actuation by a towing vehicle towing the agricultural implement or an automatic or semi-automatic brake actuation system (e.g., associated with the hitch) may be utilized to maximize the energy generated by the regenerative braking system. In certain embodiments, supplemental charging (e.g., via the alternator of a towing vehicle) may be utilized to supplement the recharging of the energy storage system for the on-board electrical system of the agricultural implement when regenerate braking is inadequate for charging. The implement's regenerative braking system may improve the overall energy efficiency of the implement. In addition, the implement's regenerative braking system may optimize the utilization of energy provided by the hydraulic system of the towing vehicle to power other system functions.

FIG. 1 is a side view of an embodiment of an agricultural system 10. The agricultural system 10 includes a tow vehicle 12 and an agricultural implement 14. The tow vehicle 12 may be any vehicle suitable for towing the agricultural implement 14, such as a tractor, off-road vehicle, work vehicle, and so forth. Additionally, the agricultural implement 14 may be any implement suitable for agricultural use, such as a tillage implement, a fertilizer implement, a seeding implement, or another agricultural implement. In certain embodiments, one or more additional implements may be coupled to and towed behind the agricultural implement 14. The agricultural system 10 travels over a surface 16, such as the ground, a road, a field, or another surface.

The tow vehicle 12 is coupled to the agricultural implement 14 by a hitch assembly 18 (e.g., hitch). As described in greater detail below, the agricultural implement 14 includes a regenerative braking system to provide power (e.g., recharge) to an energy storage device for an on-board electrical system of the implement. The regenerative braking system may be utilized in conjunction with supplemental charging from the towing vehicle 12 (e.g., via the alternator of the towing vehicle). In certain embodiments, the supplemental charging may be via mechanical driven charging, hydraulic driven charging, or supplemental charging by some other means. The regenerative braking system may also maximize the energy provided for recharging the energy storage of the on-board electrical system of the implement when utilized with an implement stability/hill decent control system.

Figure 2:
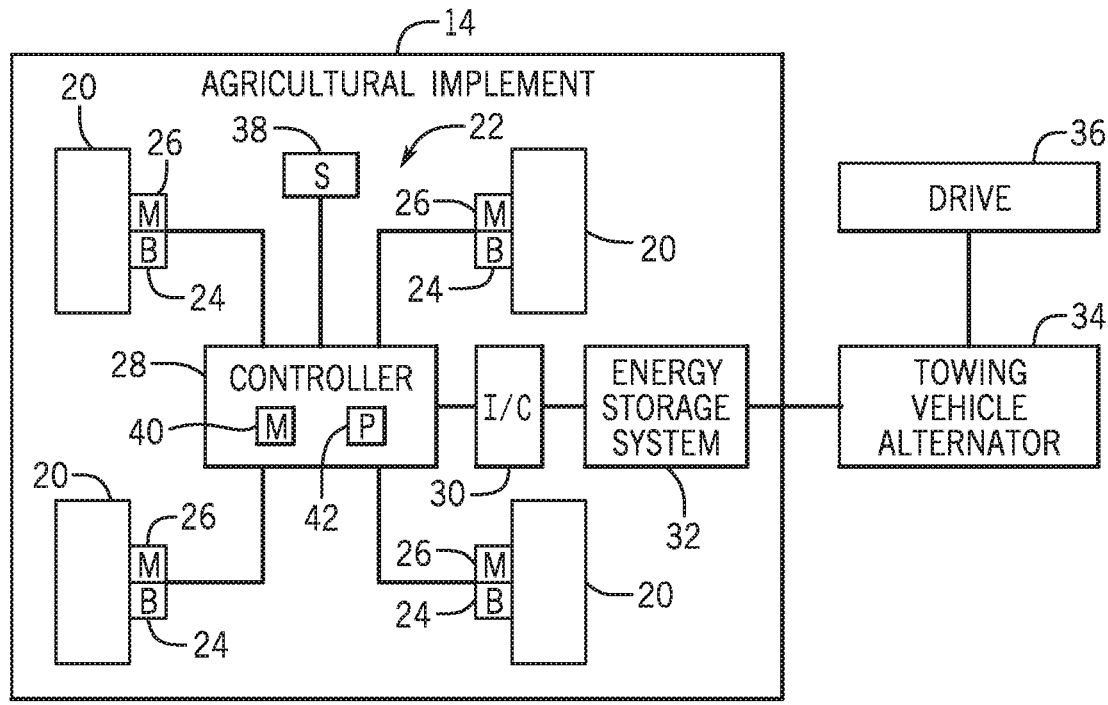
FIG. 2 is a schematic view of an embodiment of an agricultural implement having an electronic braking system, in accordance with an aspect of the present disclosure.

To more clearly illustrate, a schematic view of the agricultural implement 14 having a regenerative braking system is provided in FIG. 2. The agricultural implement 14 may include a seeder, planter, air cart, or any other implement that utilizes an on-board electrical system and braking system. As illustrated, the agricultural implement 14 includes a plurality of wheels 20. As depicted, the number of wheels is 4. In other embodiments, the number of wheels 20 may vary (e.g., 2, 3, 4, 5, 6, etc.). Each of the wheels 20 is coupled to a regenerative braking system 22 configured to slow or stop the agricultural implement 14. In certain embodiments, each of the wheels 20 is coupled to brakes 24 (e.g., friction brakes of a hydraulic brake system) that may be utilized when the regenerative braking system 22 is not sufficient to slow or stop the agricultural implement 14. In certain embodiments, the implement 14 may not include friction brakes.

The regenerative braking system 22 includes an electric motor 26 coupled to a respective wheel 20. In certain embodiments, more than one wheel 20 may utilize the same electric motor 26. During acceleration (e.g., drive mode) the electric motors 26 rotate in a first direction. However, during braking, the electric motors 26 work in the opposite direction to slow or stop the agricultural implement. During this braking (e.g., regeneration mode), the electric motors 26 act as electrical generators to provide energy for storage. The electric motors 26 are coupled to a controller 28 (e.g. motor controller). The controller 28 is coupled to an inverter/converter 30 and an energy storage system 32. The energy storage system 32 may include one or more batteries or capacitors. The energy storage system 32 stores power generated by the regenerative braking system 22 and powers the implement's electrical system. The inverter/converter 30 regulates the power provided to the energy storage system 32 and the power provided to the implement's electrical system via the energy storage system 32.

The energy storage system 32 is also coupled to an alternator 34 (e.g., coupled to a drive 36) of a vehicle towing the agricultural implement 14. In certain embodiments, when power generated by the regenerative braking system 22 is insufficient to recharge the energy storage system 32, power may be provided via hydraulic driven charging (via the alternator) to supplement the recharging of the energy storage system 32.

In certain embodiments, the implement 14 includes one or more sensors 38 coupled to the controller 28. The one or more sensors 38 may include an angle or tilt sensor to determine the orientation of the implement 14 (e.g., for determining whether the implement is descending a hill). The feedback from the one or more sensors 38 may be provided to the controller 28 to be utilized in a stability/hill decent control system.

The controller 28 is configured to control (e.g., actuate or disengage) the regenerative braking system 22 via the electric motors 26. In particular, the controller 28 may determine which mode (e.g., drive or regeneration mode) the electric motors 26 operate under. In certain embodiments, the controller 28 may utilize a stability/hill decent control system in conjunction with the regenerative braking system 22 to control the speed of wheels 20 to maximize the energy generated by the regenerative braking system 22 while operating in hilly terrain or during road transport. The controller 28 may utilize feedback from the one or more sensors 38 when utilizing the stability/hill decent control. The controller 28 may determine that regenerative braking system 22 is not sufficient to slow or stop the agricultural implement 14 so that the brakes 24 may be utilized instead of or in addition to the regenerative braking system 22.

In certain embodiments, the controller 28 is configured to detect a charge status of the energy storage system 32 and to determine whether regenerative braking is sufficient to recharge the energy storage system 32 based on the charge status. If regenerative braking is not sufficient, the controller 28 may enable utilization of supplemental charging (via the alternator 34 of the towing vehicle) to supplement recharging of the energy storage system 32. Further, the controller 28 enables the utilization of the energy storage system 32 to charge the electrical system of the agricultural implement 14.

The controller 28 includes a memory 40 and a processor 42. In some embodiments, the processor 42 may include one or more general purpose processors, one or more application specific integrated circuits, one or more field programmable gate arrays, or the like. Additionally, the memory 40 may be any tangible, non-transitory, computer readable medium that is capable of storing instructions executable by the processor 42 and/or data that may be processed by the processor 42. In other words, the memory 40 may include volatile memory, such as random access memory, or non-volatile memory, such as hard disk drives, read only memory, optical disks, flash memory, and the like.

Figure 3:
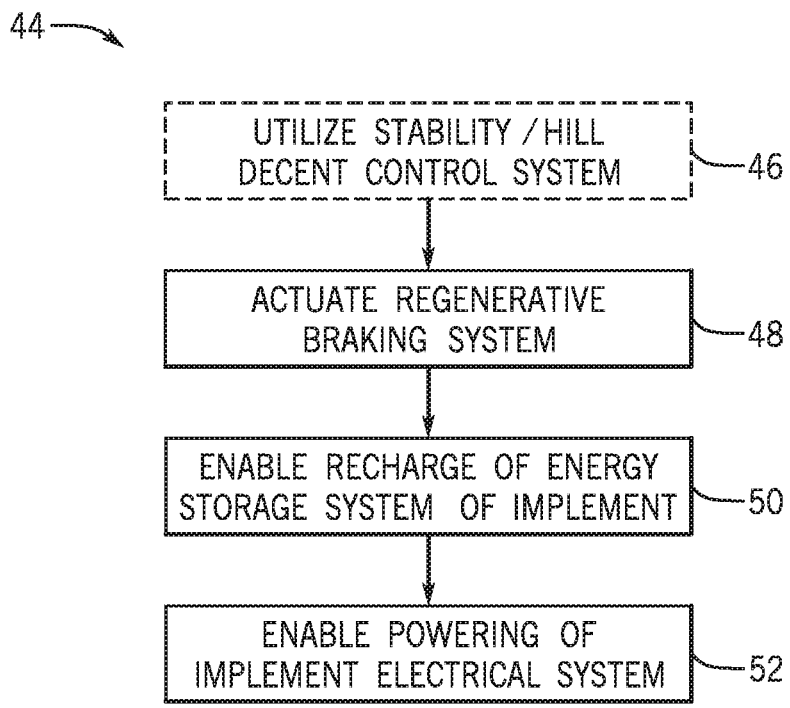
FIG. 3 is a flowchart of an embodiment of a method for utilizing the regenerative braking system of FIG. 2, in accordance with an aspect of the present disclosure.

FIG. 3 is a flowchart of an embodiment of a method 44 for utilizing the regenerative braking system 22 of FIG. 2. The steps of the method 44 may be performed by the controller 28 of the agricultural implement 14 described above. One or more of the steps of the method 44 may be performed simultaneously and/or in a different order. In certain embodiments, the method 44 includes utilizing a stability/hill decent control system (block 46). In particular, the stability/hill decent control system may be utilized in conjunction with the regenerative braking system 22 to control the speed of wheels 20 to maximize the energy generated by the regenerative braking system 22 while operating in hilly terrain or during road transport (e.g., to slow down for turning maneuvers). The method 44 also includes actuating the regenerative braking system 22 to slow or stop the agricultural implement (block 48). In certain embodiments, the regenerative braking system may be already actuated and the regenerative braking system 22 may be altered to slow the implement even more or faster, to stop the implement sooner, to slow the implement 14 more slowly, or to disengage utilization of the regenerative braking system 22. The method 44 further includes enabling recharge of the energy storage system 32 of the implement 14 via the energy or power generated by the electric motors 26 of the regenerative braking system 22 during regenerative braking (block 50). The method 44 even further includes enabling powering of the implement's electrical system via the energy storage system 32 (block 52).

Figure 4:
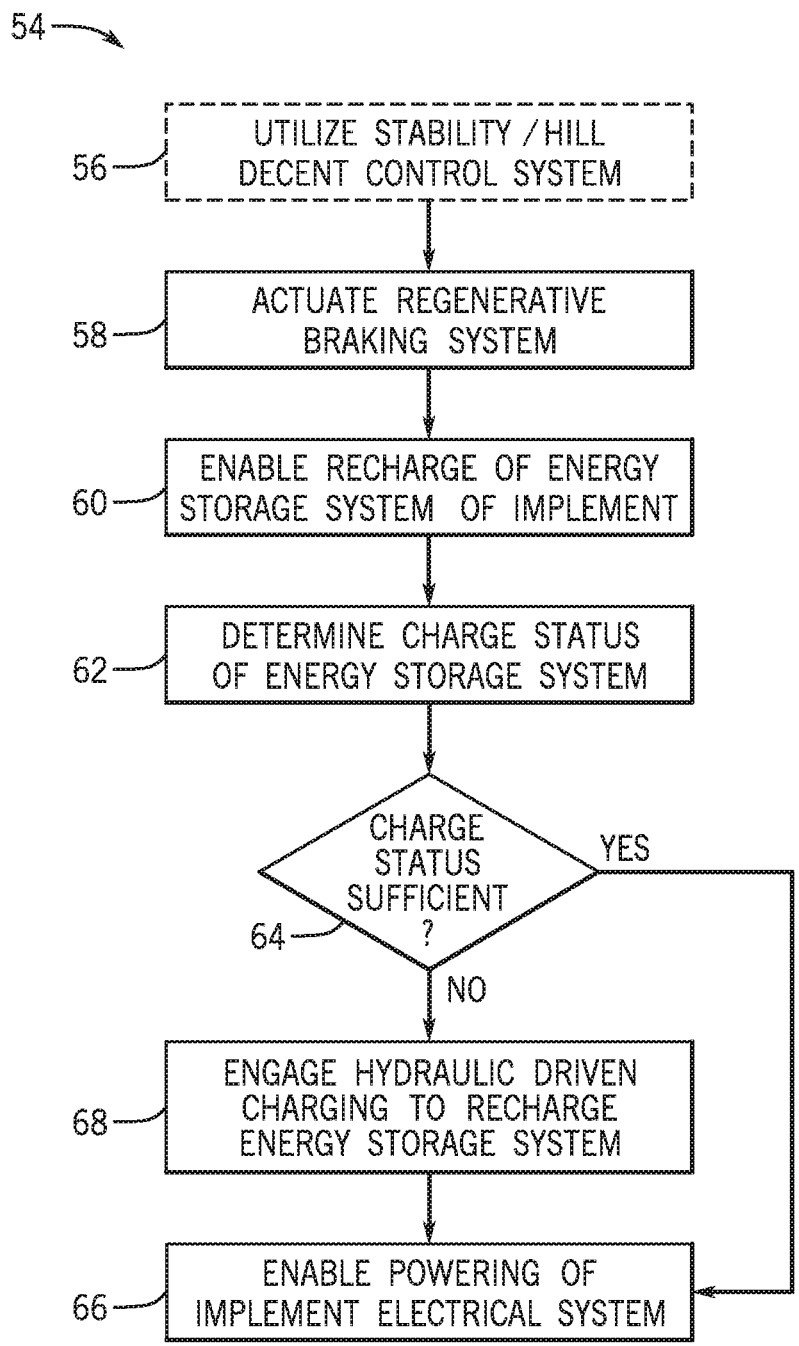
FIG. 4 is a flowchart of an embodiment of a method for utilizing the regenerative braking system of FIG. 2 (e.g., utilizing supplemental hydraulic driven charging), in accordance with an aspect of the present disclosure.

FIG. 4 is a flowchart of an embodiment of a method 54 for utilizing the regenerative braking system 22 of FIG. 2 (e.g., utilizing supplemental hydraulic driven charging). The steps of the method 54 may be performed by the controller 28 of the agricultural implement 14 described above. One or more of the steps of the method 54 may be performed simultaneously and/or in a different order. In certain embodiments, the method 54 includes utilizing a stability/hill decent control system (block 56). In particular, the stability/hill decent control system may be utilized in conjunction with the regenerative braking system 22 to control the speed of wheels 20 to maximize the energy generated by the regenerative braking system 22 while operating in hilly terrain or during road transport. The method 54 also includes actuating the regenerative braking system 22 to slow or stop the agricultural implement (block 58). In certain embodiments, the regenerative braking system may be already actuated and the regenerative braking system 22 may be altered to slow the implement even more or faster, to stop the implement sooner, to slow the implement 14 more slowly, or to disengage utilization of the regenerative braking system 22. The method 54 further includes enabling recharge of the energy storage system 32 of the implement 14 via the energy or power generated by the electric motors of the regenerative braking system 22 during regenerative braking (block 60).

The method 54 includes determining a charge status of the energy storage system 32 (block 62). In particular, the method 54 includes determining whether the charge status is sufficient in light of recharging via regenerative braking (block 64). If charging of the energy storage system 32 was sufficient with the power from regenerative braking, the method 54 includes enabling powering of the implement's electrical system via the energy storage system (block 66). However, if charging of the energy storage system 32 is not sufficient with the power from regenerative braking, the method 54 includes engaging hydraulic driven charging (e.g., utilizing the alternator 34 of the towing vehicle) to supplement recharging of the energy storage system 32 (block 68). Upon supplemental recharging of the energy storage system 32, the method 54 includes enabling powering of the implement's electrical system via the energy storage system 32 (block 66).

While only certain features of the disclosure have been illustrated and described herein, many modifications and changes will occur to those skilled in the art. It is, therefore, to be understood that the appended claims are intended to cover all such modifications and changes as fall within the essence of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An agricultural implement, comprising:
   an energy storage system configured to provide power an electrical system of the agricultural implement;
   a regenerative braking system configured to slow or stop the agricultural implement and to provide power to the energy storage system;
   a controller configured to articulate or disengage the regenerative braking system;
   wherein the controller is configured to determine a charge status of the energy storage system; the controller is configured to determine a charge status of the energy storage system is sufficient to recharge the energy storage system based on the charge status of the energy storage system; the controller is configured to enable supplemental charging to be utilized to supplement recharging of the energy storage system when the utilization of the regenerative braking system is not sufficient to recharge the energy storage system.

2. The agricultural implement of claim 1, wherein the controller is configured to utilize a hill decent control system for the agricultural implement, manual braking actuation of a towing vehicle towing the agricultural implement, or an automatic or semi-automatic brake actuation system in conjunction with the regenerative braking system to maximize the power provided to the energy storage system.

3. The agricultural implement of claim 1, wherein the supplemental charging is provided by an alternator of a towing vehicle towing the agricultural implement.

4. The agricultural implement of claim 1, comprising a plurality of wheels, and wherein the regenerative braking system comprises an electric motor coupled to each wheel of the plurality of wheels.

5. The agricultural implement of claim 1, wherein the energy storage system comprises a plurality of batteries or capacitors.

6. A regenerative braking system for an agricultural implement, comprising:
   a plurality of electric motors, wherein each electric motor of the plurality of motors is coupled to a respective wheel of the agricultural implement; and
   a controller configured to enable the plurality of motors to operate as generators in a regenerative braking mode to recharge an energy storage system; the energy storage system configured to provide power an electrical system of the agricultural implement, wherein the energy storage system comprises a plurality of batteries or capacitors;
   wherein the controller is configured to determine a charge status of the energy storage system; wherein the controller is configured to determine whether utilization of the regenerative braking system is sufficient to recharge the energy storage system based on the charge status of the energy storage system; wherein the controller is configured to enable supplemental charging to be utilized to supplement recharging of the energy storage system when the utilization of the regenerative braking system is not sufficient to recharge the energy storage system.

7. The regenerative braking system of claim 6, wherein the controller is configured to utilize a hill decent control system for the agricultural implement, manual braking actuation of a towing vehicle towing the agricultural implement, or an automatic or semi-automatic brake actuation system in conjunction with the regenerative braking system to maximize the power provided to the energy storage system.

8. The agricultural implement of claim 6, wherein the supplemental charging is provided by an alternator of a towing vehicle towing the agricultural implement.

9. A method for utilizing a regenerative braking system for an agricultural implement, comprising:
actuating, via a controller, the regenerative braking system to slow or stop the agricultural implement;
enabling, via the controller, recharging of an energy storage system of the agricultural implement;
determining via the controller, whether actuation of the regenerative braking system is sufficient to recharge the energy storage system; and
enabling, via the controller, hydraulic driven charging to supplement recharging of the energy storage system when actuation of the regenerative braking system is not sufficient to recharge the energy storage system.

10. The method of claim 9, comprising utilizing, via the controller, a hill decent control system for the agricultural implement in conjunction with actuating the regenerative braking system to maximize power provided to the energy storage system.

11. The method of claim 9, wherein actuating, via the controller, the regenerative braking system to slow or stop the agricultural implement comprises causing electric motors coupled to wheels of the agricultural implement to operate as generators in a regenerative braking mode to recharge the energy storage system.

* * * * *